United States Patent [19]
Aimoto et al.

[11] Patent Number: 6,034,911
[45] Date of Patent: *Mar. 7, 2000

[54] SEMICONDUCTOR MEMORY DEVICE FOR A RAPID RANDOM ACCESS

[75] Inventors: Yoshiharu Aimoto; Tohru Kimura; Yoshikazu Yabe, all of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/729,422

[22] Filed: Oct. 11, 1996

[30] Foreign Application Priority Data

Oct. 13, 1995 [JP] Japan .................................. 7-318654

[51] Int. Cl.⁷ .................................................. G11C 8/00
[52] U.S. Cl. .............................. 365/230.03; 365/230.06; 365/238.5
[58] Field of Search .............................. 365/230.03, 207, 365/235, 238.5, 230.06, 185.11

[56] References Cited

U.S. PATENT DOCUMENTS

| | | | |
|---|---|---|---|
| 4,486,860 | 12/1984 | Takemae et al. | 365/230.03 |
| 4,541,090 | 9/1985 | Shiragasawa | 365/201 |
| 4,926,385 | 5/1990 | Fujishima et al. | 365/230.03 |
| 4,934,826 | 6/1990 | Miyatake et al. | 365/230.01 |
| 5,075,890 | 12/1991 | Itoh et al. | 365/189.01 |
| 5,267,214 | 11/1993 | Fujishima et al. | 365/230.03 |
| 5,274,596 | 12/1993 | Watanabe | 365/230.03 |
| 5,293,348 | 3/1994 | Abe | 365/230.03 |
| 5,353,427 | 10/1994 | Fujishima et al. | 365/230.03 |
| 5,355,342 | 10/1994 | Ueoka | 365/230.03 |
| 5,367,495 | 11/1994 | Ishikawa | 365/230.03 |
| 5,483,488 | 1/1996 | Sanada | 365/230.03 |
| 5,517,461 | 5/1996 | Unno et al. | 365/230.03 |
| 5,528,552 | 6/1996 | Vamisaki | 365/238.5 |
| 5,631,873 | 5/1997 | Furutani | 365/230.03 |

FOREIGN PATENT DOCUMENTS

| | | |
|---|---|---|
| 56-137589 | 10/1981 | Japan . |
| 58-196671 | 11/1983 | Japan . |
| 62-241198 | 10/1987 | Japan . |
| 64-14795 | 1/1989 | Japan . |
| 64-57495 | 3/1989 | Japan . |
| 3-1394 | 1/1991 | Japan . |

*Primary Examiner*—Tan T. Nguyen
*Attorney, Agent, or Firm*—Sughrue, Mion, Zinn, Macpeak & Seas, PLLC

[57] ABSTRACT

A random access memory device includes a plurality of memory blocks, a memory block selecting circuit and a column decoder. Each memory block comprise a memory cell array including a plurality of word lines, a plurality of bit line pairs and a plurality of memory cells, and a peripheral circuit including sense amplifiers which amplify data read out onto bit line pairs when a memory block select signal for a particular memory block is active to connect all memory cells contained in one row with associated bit line pairs. An access control circuit changes a block address and a column address while maintaining a row address unchanged, thus performing a rapid random access of memory cells contained in a common row over the memory blocks.

7 Claims, 7 Drawing Sheets

FIG. 4 row R row R

⋮ row R

SEMICONDUCTOR MEMORY DEVICE FOR A RAPID RANDOM ACCESS

BACKGROUND OF THE INVENTION (a) Field of the Invention

The invention relates to a semiconductor memory device, and in particular, to a semiconductor memory device for enabling a rapid random access while saving power dissipation.

(b) Description of the Related Art

For a semiconductor memory device, in particular, for a dynamic random access memory device (DRAM), a page mode or nibble mode technique is implemented as a technology which achieves a higher access rate. Recently, a technology referred to as synchronous technique (synchronous DRAM) was developed. Also adopted was an interleave technique in which a memory unit is divided into a plurality of banks, to which addresses are consecutively allocated, and an access demand is consecutively applied for each bank independently to achieve a parallel operation.

The synchronous technique, the nibble mode and the interleave technique are technologies which achieve a higher rate when accessing data located at consecutive addresses, and hence have scarcely any effect when accessing random addresses. By contrast, the page mode allows an access of a group of memory cells, which are located in a single row and selected by a row address, to be accessed consecutively and in a random manner by merely changing a column address without repeating the row address, and is highly appreciated in the field where a rapid random access is required.

Figure 1:
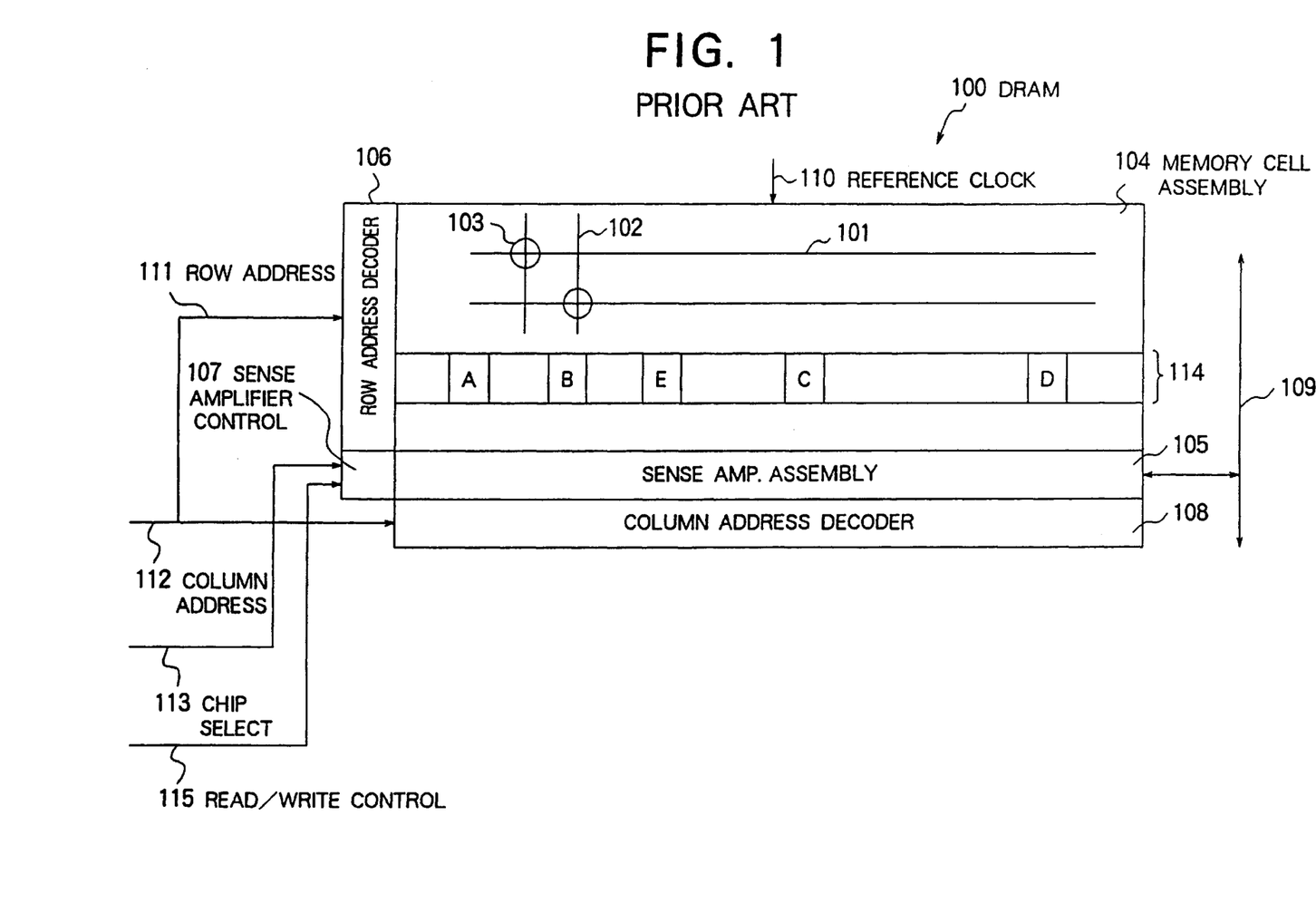
FIG. 1 is a block diagram of a conventional semiconductor memory device (DRAM) which has a page mode function.

FIG. 1 is a block diagram of a conventional DRAM which has such a page mode function. In this example, DRAM 100 essentially comprises: a memory cell assembly 104 including a plurality of word lines 101, a plurality of bit line pairs 102 which intersect the word lines 101 while being insulated therefrom, and a plurality of memory cells 103 which are located at the intersections between the bit line pairs and the word lines 101 and which allow a read-out of stored data onto a selected bit line pair 102 or a storage of data from a selected bit line pair 102 when a particular word line 101 is at its selected level; and an associated peripheral circuit.

The peripheral circuit includes a sense amplifier assembly 105 including individual sense amplifiers each for amplifying data which is read out onto a corresponding bit line pair, read/write controlling switches and other switches which precharge/equalize the bit line pairs 102, a row address decoder 106 which selects a particular word line 101 in accordance with an input row address, a sense amplifier control circuit 107 which controls the sense amplifier assembly 105, and a column address decoder 108 which selects a particular bit line pair on which an output is to be delivered in accordance with an input column address.

The dynamic random access memory also includes a pair of input/output data lines 109, and receives from outside the memory cell a reference clock 110, a row address 111, a column address 112, a chip select signal 113 and a read/write control signal 115. In FIG. 1, a particular row 114 is exemplarily selected from the memory cell assembly 104 and shown in detail.

Figure 2:
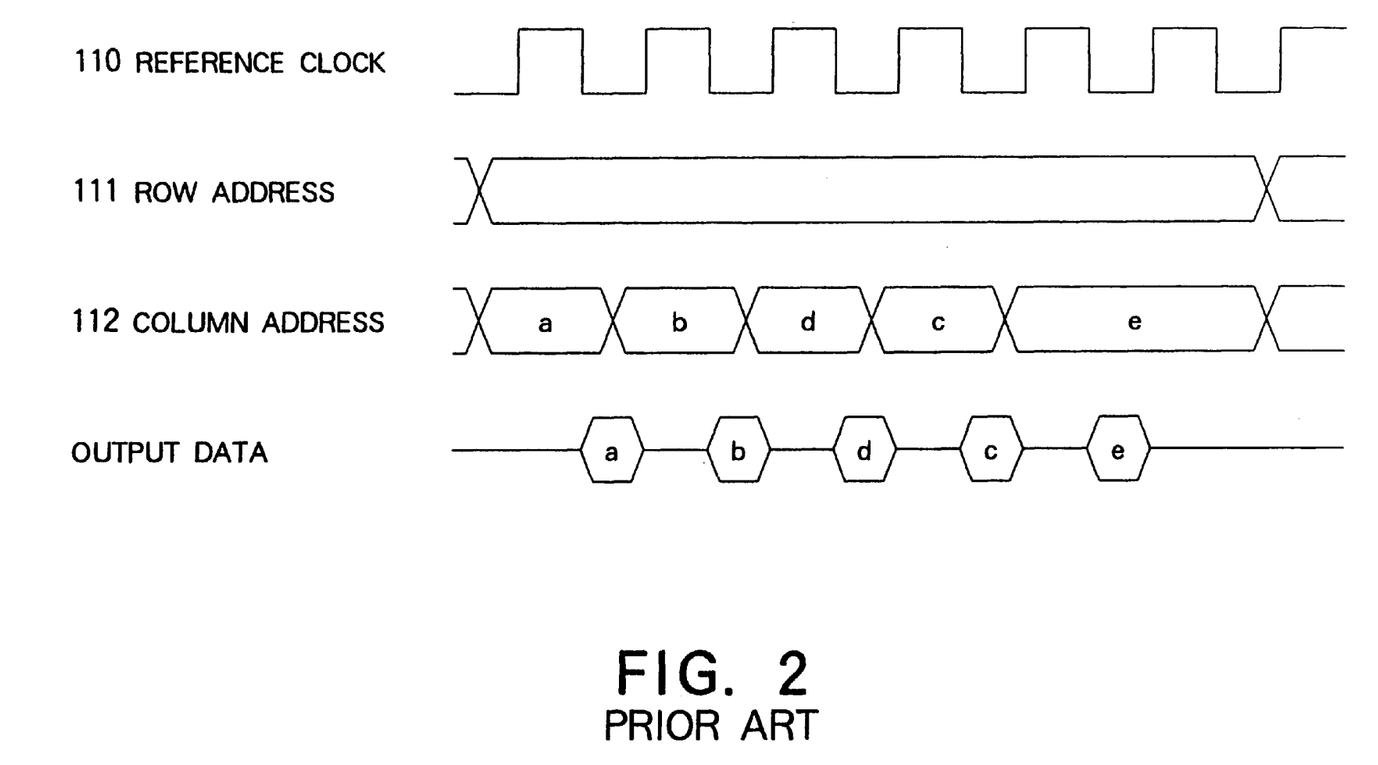
FIG. 2 is a timing chart illustrating the operation of the semiconductor memory device shown in FIG. 1.

FIG. 2 is a timing chart illustrating the operation of the DRAM 100 shown in FIG. 1 when memory cells "a" to "e" located within the row 114 are accessed randomly in the sequence of "a", "b", "d", "c", and "e". When a row address 111 is input in synchronism with a reference clock 110, the row address decoder 106 brings the particular row 114 corresponding to the row address 111 to its selected level, thus connecting the respective memory cells disposed in the row 114 with the bit line pair 102, and the sense amplifier assembly 105 operates under the control of the sense amplifier control unit 107 to amplify the data which is read out onto the bit line pair 102. This operation continues for the duration that the row address 111 continues as long as the chip select signal 113 is active.

When a column address 112 which selects a memory cell "a" is input in synchronism with the reference clock 110, the column address decoder 108 responds thereto by selecting the bit line pair 102 which is connected to the memory cell "a" and connecting the bit line pair 102 with the input/output data lines 109. In this manner, the data from an initial memory cell "a" is read out at a timing as shown in FIG. 2 for a read operation. Subsequently, as the column address 112 is sequentially changed in synchronism with the reference clock 110 while maintaining the row address 111 fixed, memory cells "b", "d", "c" and "e" are consequentially accessed. Accordingly, it will be seen that, assuming that one row contains m bits, a random access is achieved at a higher rate in a range within the m bits.

There is proposed another semiconductor memory device which incorporates a plurality of higher rate technologies. For example, Patent Publication No. JP-A-58 (1983)-196, 671 proposes a semiconductor memory device including a mode controlling latch and a selecting circuit which selects one of the page mode and nibble mode which corresponds to a set-up in the mode controlling latch, thus allowing the supported higher rate operation mode to be changed in accordance with the set-up in the mode controlling latch. Also, Patent Publication No. JP-A-3 (1991)-1,394 proposes a semiconductor memory device including a mode specifying register and a selecting circuit which selects one of the page mode and the interleave control mode in accordance with the set-up in the mode specifying register, thus changing the supported higher rate operation mode in accordance with the set-up in the register.

As mentioned above, a higher rate operation of a semiconductor memory device is realized by employing a page mode in a field where a rapid random access is required. However, in a conventional semiconductor memory device which is provided with the page mode function, the random access at a higher rate is limited to memory cells disposed in a single row which is selected by a row address. To extend a region over which the random access is enabled, it is necessary to increase the number of memory cells disposed in one row. This increases the number of sense amplifiers which are activated at a time, presenting a difficulty that the power dissipation becomes greater.

In a semiconductor memory device which is provided with a page mode as well as other types of higher rate technologies such as the nibble mode or interleave control mode, only one mode is selected at any time. Accordingly, when the page mode is selected for the rapid random access, the area which permits rapid random access is limited to memory cells disposed in a single row, presenting the similar difficulty as mentioned above.

SUMMARY OF THE INVENTION

In view of the above, it is an object of the invention to provide a semiconductor memory which secures an increased region which permits a random access, while limiting the increase in the power dissipation.

In accordance with the invention, there is provided a semiconductor memory device comprising: a plurality of memory blocks each including a plurality of memory cells arranged in a matrix, a plurality of word lines each extending along a corresponding row of said memory cells, a plurality of bit lines each extending along a corresponding column of said memory cells, and a row address decoder for controlling the connection of one of rows of said memory cells with respective said bit lines in accordance with a row address; a common data line, disposed for said plurality of memory blocks, for outputting data from said memory blocks toward outside the memory device; a column address decoder for selectively coupling one of said bit lines with said data lines in accordance with a column address; and a block selecting section for selectively activating each said row address decoder in accordance with a block address.

In a semiconductor memory device according to the invention, when only the column address is changed while maintaining the row address as well as the block address unchanged, only one memory block which is specified by the block address is allowed to operate, and a write/read operation of data into or from a memory cell which is disposed in a row specified by the row address and which is also specified by the column address is enabled, thus enabling a rapid random access of memory cells disposed in that row in a similar manner, as in the conventional page mode function.

On the other hand, when only the block address is changed while maintaining the row address and the column address fixed, only one memory block which is specified by a current block address is allowed to operate, and a read/write operation of data from or to a memory cell on a row which is specified by the row address and which is specified by the column address is enabled again, thereby enabling a rapid random access of a common column over different rows. In a similar manner, when the block address and the column address are changed while maintaining the row address fixed, a rapid random access of a common row specified by the row address is enabled over different memory blocks. In this instance, since only one memory block is operating at any time, the power dissipation can be reduced as compared with a conventional arrangement by a factor of substantially the inverse of the number of memory blocks.

In the described arrangement of the invention, the column address decoder may be provided in common to the plurality of memory blocks, or may be provided as decoder sections each disposed in the peripheral circuit of each memory block. Further, a unit memory comprising a single semiconductor memory device as mentioned may be utilized to construct a multiple semiconductor memory device which comprises a plurality of such unit memories. In this instance, an access controller may be provided which controls the random access of memory cells disposed in a common row of different memory blocks independently for each unit memory, by changing the block address and the column address while maintaining the row address fixed.

DESCRIPTION OF THE PREFERRED EMBODIMENTS

Referring to the accompanying drawings, several embodiments of the invention will now be described in detail.

Figure 3:
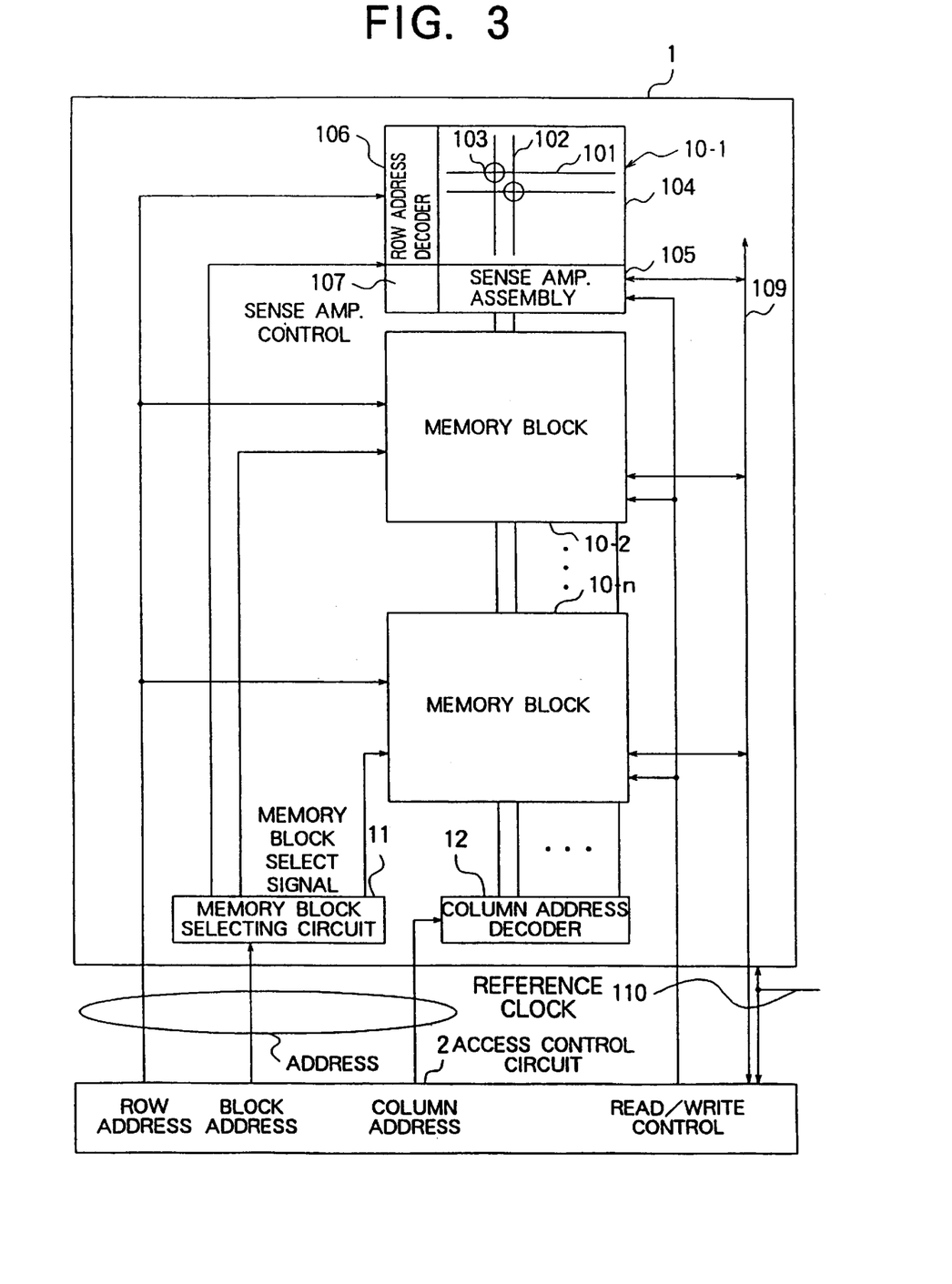
FIG. 3 is a block diagram of an embodiment of the invention.

FIG. 3 shows a memory device according to an embodiment of the invention. In this Figure, the memory device 1 is associated with an access control circuit 2 which controls accessing of the memory device 1 during a read/write operation. Both the memory device 1 and the access control circuit 2 operate in synchronism with a reference clock 110.

The memory device 1 comprises a plurality of memory blocks 10-1 to 10-n, each having a configuration identical to one another, a memory block selecting circuit 11 and a column address decoder 12. Each of the memory blocks 10-1 to 10-n is connected to an input/output data line 109, which is used in common to all the blocks. The access control circuit 2 delivers a row address and a read/write control signal, which are input in common to these blocks. In addition, the memory block selecting circuit 11 provides a memory block select signal to individual memory blocks 10-1 to 10-n. Further, an output signal from the column decoder 12 is input in common to all the memory blocks 10-1 to 10-n. The column decoder 12 selects a particular bit line pair which is used for output, by activating only one output signal in accordance with an input column address.

As illustrated for the memory block 10-1, each of the memory blocks 10-1 to 10-n comprises a memory cell array 104 and a peripheral circuit including a sense amplifier assembly 105, a row address decoder 106 and a sense amplifier control circuit 107.

The memory cell array 104 comprises a plurality of word lines 101, a plurality of bit line pairs 102 which intersect the word lines 101 while insulated therefrom, and a plurality of memory cells 103. Each of the memory cells 103 is disposed at a corresponding intersection between the bit line pair 102 and the word line 101. Stored data in each memory cell 103 is read out onto a particular bit line pair 102 and the data from a particular bit line pair 102 is written to a memory cell, when a corresponding word line 101 is at the word lines selected level.

The row address decoder 106 of a particular memory block establishes a word line 101, which corresponds to an input row address, at its selected level in synchronism with the reference clock 110 when a memory block select signal for that memory block is active, thereby connecting all the memory cells 103 disposed in that row with respective bit line pair 102.

The sense amplifier assembly 105 includes individual sense amplifiers each of which amplifies data read out onto a corresponding bit line pair 102, column switches which control read/write operation, and control switches which precharge/equalize the bit line pair 102. The sense amplifier assembly operates to amplify data read out from a memory cell under the control of the sense amplifier control circuit 107. The sense amplifier control circuit 107 is effective to operate the sense amplifier assembly 105 only when a particular memory block select signal is active for the memory block in which it is disposed.

On the other hand, the memory block selecting circuit 11 decodes a block address from the access control circuit 2, and makes a memory block select signal active for only one memory block which corresponds to the decoded block address. The column address decoder 12 decodes a column address supplied from the access control circuit 2, and selects in each memory block a particular bit line pair 102 which corresponds to the decoded column address.

An address set used in the memory device 1 comprises a row address, a block address and a column address. The column address is used to select memory cells disposed in one column over the memory blocks 10-1 to 10-n. For example, when a memory block is constructed so that the number of bits per column is equal to 64 bits, the six least significant bits of an entire address represent a column address. The block address is used to select one of the memory blocks 10-1 to 10-n. For example, when eight memory blocks are used, the block address is represented by three bits. The row address is used to select a particular row in the memory block. For example, when one memory block contains 128 rows, the row address is represented by seven bits.

When accessing the memory device 1, the access control circuit 2 delivers an address comprising a row address, a block address and a column address as well as read/write control signal to the memory device 1 in synchronism with the reference clock 110. For a write operation, data to be written is delivered onto the input/output data line 109 in synchronism with the reference clock 110.

When an address set is delivered from the access control circuit 2, the row address is input in common to the respective memory blocks 10-1 to 10-n, the block address is input to the memory block selecting circuit 11, and a column address is input to the column address decoder 12. The memory block selecting circuit 11 selects a particular memory block which corresponds to the block address, such as memory block 10-1, and the memory block select signal for that memory block is made active.

In the memory block 10-1 for which the memory block select signal is made active, the row address decoder 106 establishes the word line 101 of the row, which corresponds to the input row address, at its selected level in synchronism with the reference clock 110, thereby connecting the individual memory cells 103 disposed in that row with the respective bit line pairs 102. On the other hand, the sense amplifier control circuit 107 of the selected memory block 10-1 activates the associated sense amplifier assembly 105 when the memory block select signal for that memory block is made active, whereupon the sense amplifier assembly 105 operates to amplify data read out onto the bit line pairs 102. The column address decoder 12 operates to select a particular bit line pair 102, which corresponds to the input column address, in synchronism with the reference clock 110. In this manner, for a read operation, data is read out from the memory block 10-1 onto the input/output data line 109 in synchronism with the reference clock 110. For a write operation, data from the input/output data line 109 is written into the memory block 10-1. At this time, the memory block select signal remains inactive for the remaining memory blocks 10-2 to 10-n, and accordingly, the row address decoders 106 of those memory blocks do not perform a row select operation, and the associated sense amplifier assemblies 105 do not operate.

Subsequently, when different columns are to be accessed for the same row address and the same block address, the access control circuit 2 maintains the row address and the block address unchanged, and changes only the column address in synchronism with the reference clock 110 for a read/write operation. In this instance, the address of the bit line pair 102 which is specified by the column decoder 12 is changed in accordance with the input column address, thereby accessing different memory cells in the same row of the same memory block 10-1.

On the other hand, when different blocks and columns are to be accessed while the row address remains unchanged, subsequent to the access as described above, the access control circuit 2 maintains the row address unchanged and changes the block address and column address in synchronism with the reference clock 110 for a read/write operation. In this instance, a memory block which corresponds to the changed block address is selected by the memory block selecting circuit 11, and a corresponding memory block select signal is made active. Accordingly, the row address decoder 106 of that memory block brings the word line 101 of the row, which corresponds to the input row address, to its select level in synchronism with the reference clock 110, thereby connecting the individual memory cells 103 of that row with corresponding bit line pairs 102.

The sense amplifier control circuit 107 activates the sense amplifier assembly 105 which then operates to amplifying data read out onto the bit line pair 102. The column decoder 12 selects a bit line pair 102 which corresponds to the input column address in synchronism with the reference clock 110, allowing the data to be read out from the selected memory block onto the input/output data lines 109 for a read operation and also allowing the data on the input/output data lines 109 to be written into that memory block for a write operation, both in synchronism with the reference clock 110. At this time, for the remaining memory blocks, the row address decoders 106 of those memory blocks do not perform a row select operation since the memory block select signal for those memory blocks remain inactive, and the associated sense amplifier assemblies 105 do not operate.

Figure 4:
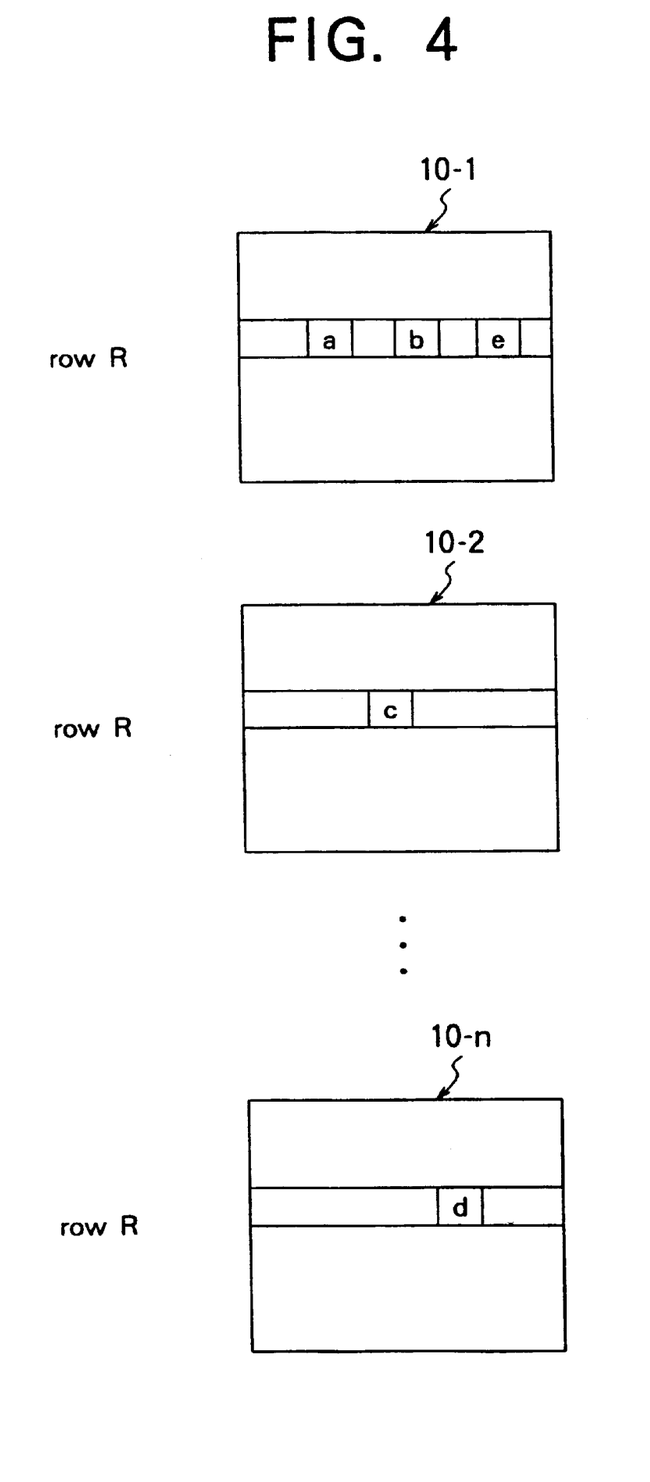
FIG. 4 is an illustration of a region over which a rapid random access is enabled.
Figure 5:
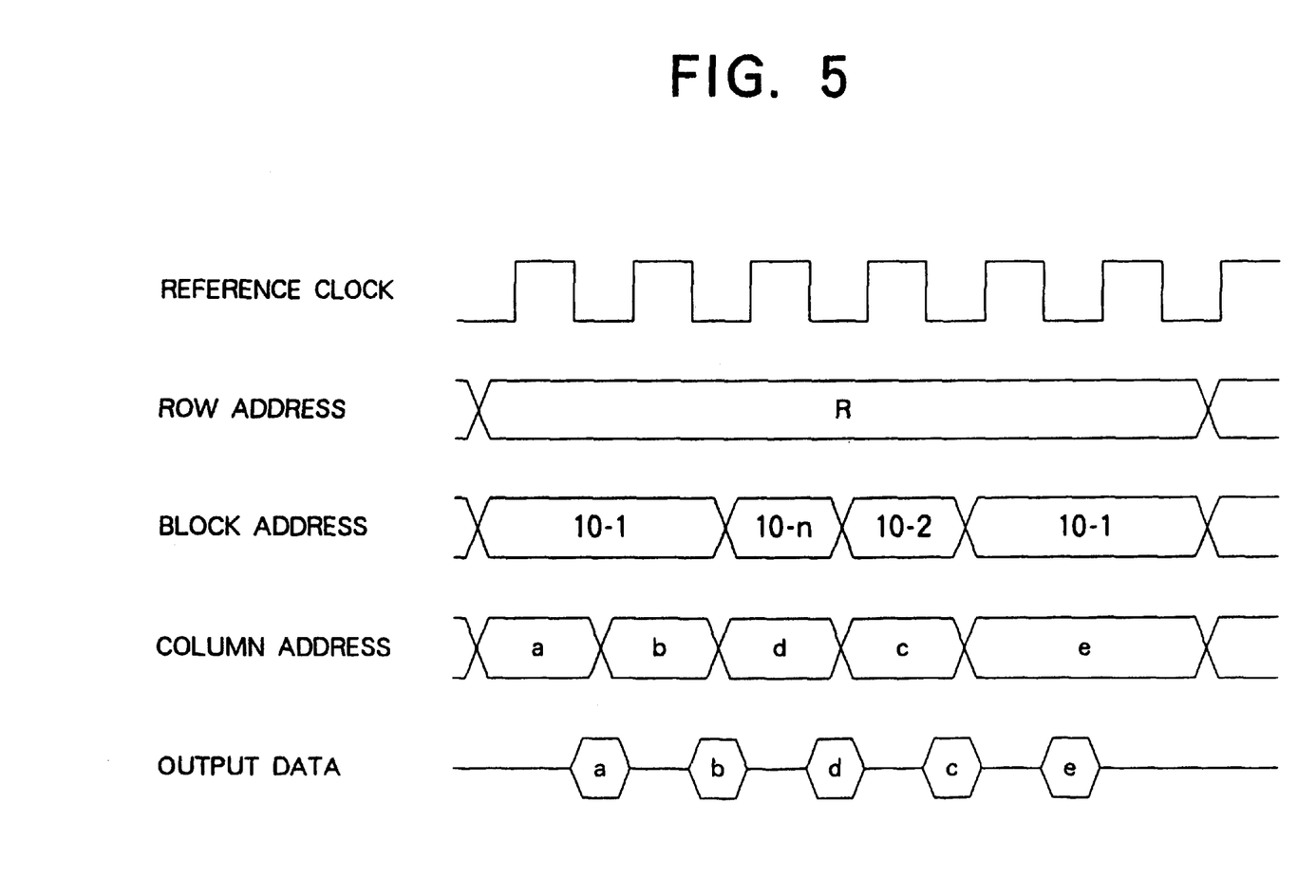
FIG. 5 is a timing chart illustrating the operation of the embodiment shown in FIG. 3.

FIG. 4 illustrates an example in which memory cells "a" to "e" included in the same row corresponding to a row address R in the memory blocks 10-1 to 10-n are to be randomly accessed for a read operation in the sequence of "a", "b", "d", "c" and "e". In this instance, as illustrated in the timing chart of FIG. 5, the access control circuit changes the block address from 10-1 through 10-n and 10-2 to 10-1 and the column address from "a" through "b", "d" and "c" to "e" in synchronism with the reference clock 110 while maintaining the row address R unchanged. Data "a", "b", "d", "c" and "e" are read out in sequence.

In the manner as described above, a random access of a common row is enabled over all the memory blocks 10-1 to 10-n in the semiconductor memory of the present embodiment. Since only one memory block for which the memory block select signal is made active is operating at a time, the power dissipation is suppressed. By way of example, assuming that a conventional semiconductor memory shown in FIG. 1 has a page width or a number of bits per row equal to 512 bits, a region of the same width over which a similar random access is enabled can be secured according to the arrangement of the semiconductor memory of the present embodiment, by using eight memory blocks, each containing 64 bits per row. In this configuration, the number of sense amplifiers which are activated at a time will be reduced to a factor of ⅛ as compared with those activated in the prior art, whereby the power dissipation of the sense amplifiers will be reduced by that factor.

Figure 6:
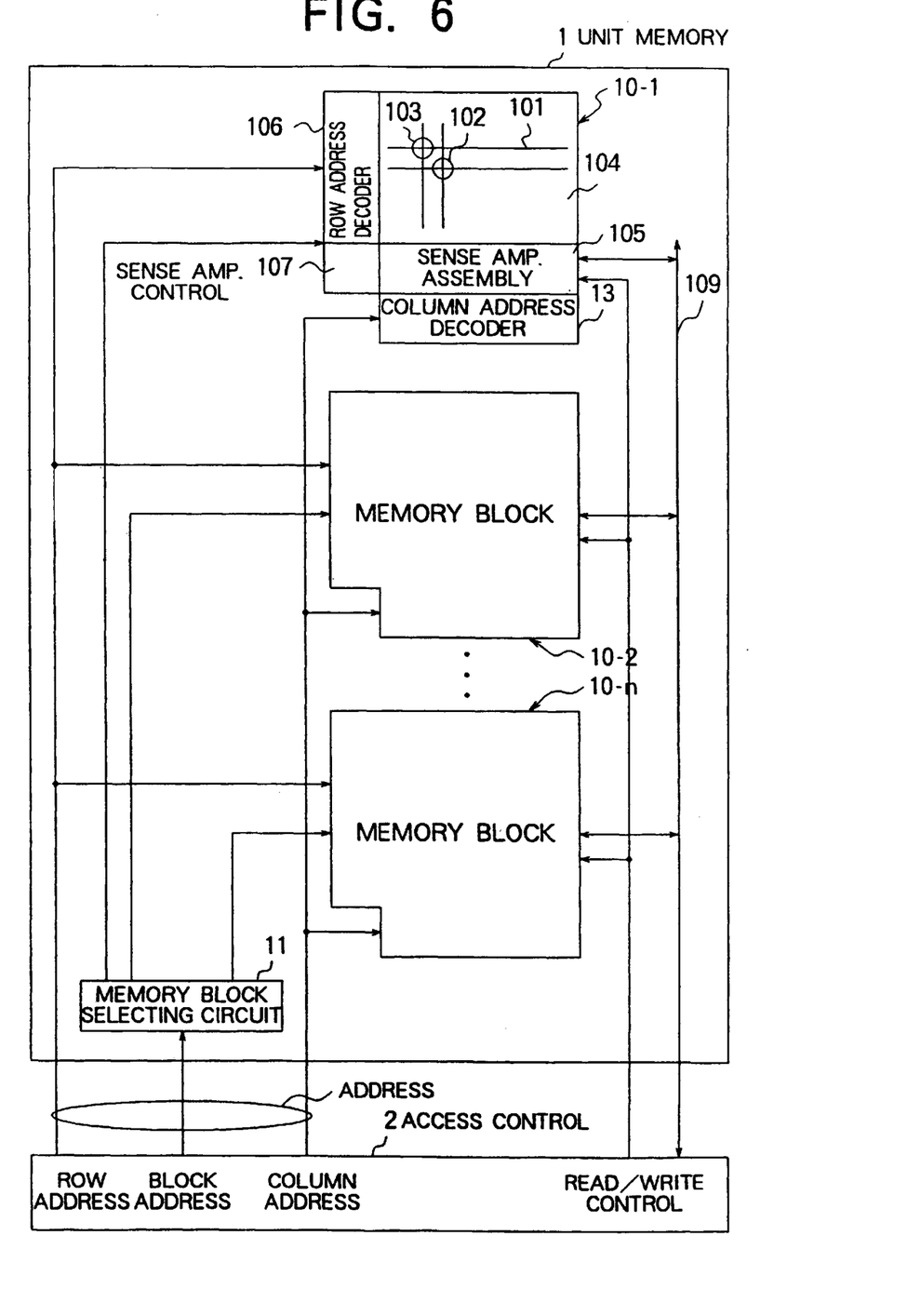
FIG. 6 is a block diagram of another embodiment of the invention.

FIG. 6 shows another embodiment of the invention wherein corresponding parts are designated by like numerals as used in FIG. 3. The semiconductor memory of this embodiment differs from the embodiment shown in FIG. 3 in that a column address decoder 13 is provided for each of the memory blocks 10-1 to 10-n in the present embodiment. The column address decoder 13 of each of the memory blocks 10-1 to 10-n receives the same column address from the access control circuit 2, and each column address decoder 13 selects a particular bit line pair 102 in accordance with the input column address only when a memory block select signal is made active for the memory block in which the column decoder 13 is provided.

Figure 7:
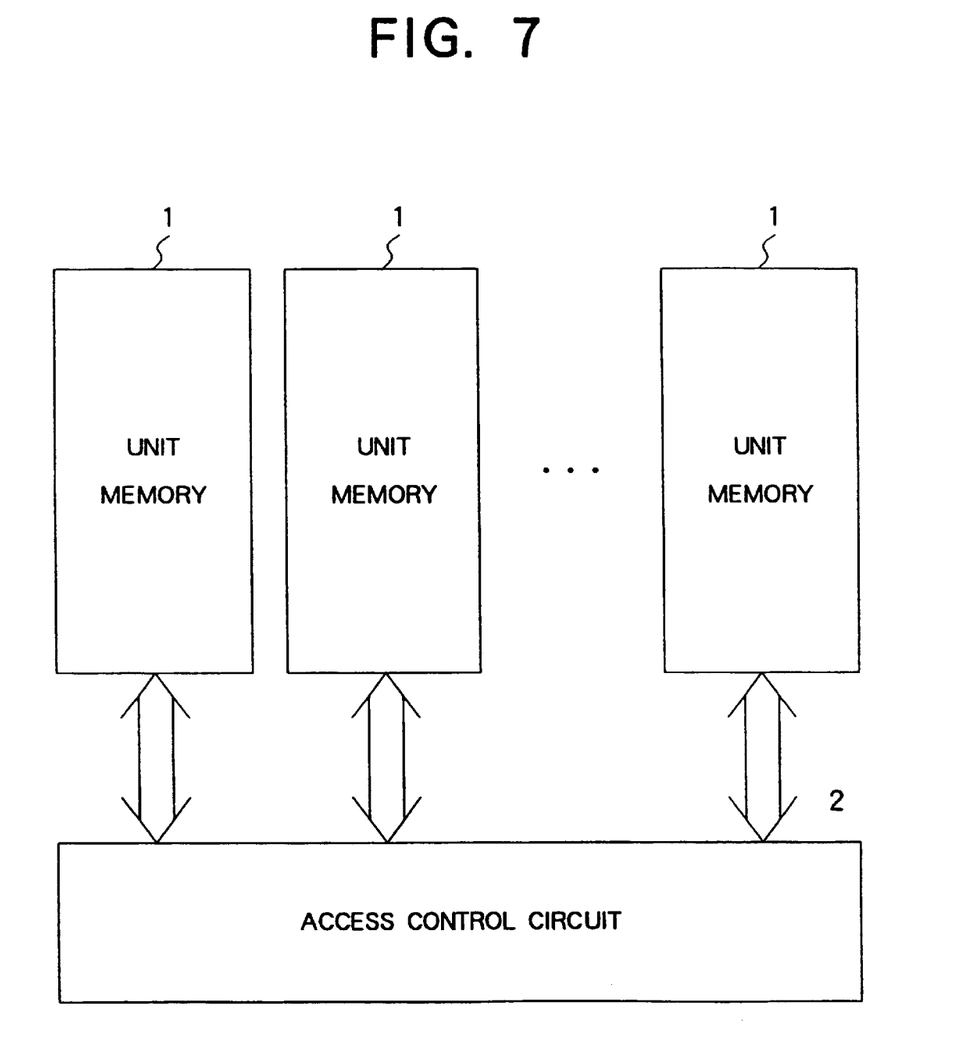
FIG. 7 is a block diagram of a further embodiment of the invention.

FIG. 7 is a block diagram of a further embodiment of the invention. In this embodiment, a memory device 1 as illustrated in FIG. 3 or 6 is utilized as a unit memory, and a multiple semiconductor memory device is constructed by providing a plurality of unit memories 1 which are connected in parallel and which are controlled by a common access control circuit 2 for a read/write operation. The access control circuit 2 performs a control of a random access of memory cells included in a common row of the individual memory blocks of the individual unit memories 1, independently for each unit memory 1, by changing the block address and the column address while maintaining the row address fixed.

It should be understood that the invention is not limited to the specific embodiments disclosed above, but that a number of changes, modifications and substitutions can be made without departing from the gist of the invention. For example, the invention is applicable to a double word line scheme in which a word address comprises a main word address and a sub-word address. In such an instance, a main word decoder which decodes the main word address to select a main word line is provided in common for all the memory blocks, and an output signal from the main word decoder is input in common to row address decoders (sub-word decoders) located within the individual memory blocks while a sub-word address is input in common to row address decoders (sub-word decoders) in the individual memory blocks.

What is claimed is:

1. A semiconductor memory comprising:
   a plurality of memory blocks each including a plurality of memory cells arranged in a matrix, a plurality of word lines each extending along a corresponding row of said memory cells, a plurality of bit lines each extending along a corresponding column of said memory cells, a row address decoder for controlling the connection of said memory cells in a row with respective said bit lines in accordance with a row address, a sense amp control circuit and a sense amplifier assembly;
   a common data line connected to said plurality of memory blocks transferring data between said memory blocks and outside the memory device;
   a column address decoder selectively coupling one of said bit lines with said data lines in accordance with a column address;
   wherein said column address decoder supplies a common column address to each of said memory blocks; and
   a block selecting section selectively activating each of said row address decoders and sense amp control circuits in accordance with a block address;
   wherein only one sense amplifier assembly, corresponding to a respective memory block, is activated at any one time.

2. A semiconductor memory device as defined in claim 1 wherein each of said memory blocks includes a sense amplifier control circuit, said sense amplifier control circuit activating said sense amplifier assembly in accordance with said block address.

3. A semiconductor memory device as defined in claim 1 wherein said column address decoder includes a plurality of decoder sections each decoder section corresponding to one of said memory blocks, each of said decoder sections being activated in accordance with said block address.

4. A semiconductor memory device comprising:
   a plurality of memory blocks each including a plurality of memory cells arranged in a matrix, a plurality of word lines each extending along a corresponding row of said memory cells, a plurality of bit lines each extending along a corresponding column of said memory cells, a row address decoder for controlling the connection of said memory cells in a row with respective said bit lines in accordance with a row address, each of said memory blocks connected to a column address decoder for selectively coupling one of said bit lines with said data lines in accordance with a common column address, a sense amp control circuit and a sense amplifier;
   a common data line connected to said plurality of memory blocks transferring data between said memory blocks and outside the memory device; and
   a block selecting section selectively activating each of said row address decoders and sense amp control circuits in accordance with a block address so that only one sense amplifier within a memory block is activated at any one time.

5. A semiconductor memory device comprising:
   a plurality of memory blocks each including a plurality of memory cells arranged in a matrix, a plurality of word lines each extending along a corresponding row of said memory cells, a plurality of bit lines each extending along a corresponding column of said memory cells, and a row address decoder for controlling the connection of said memory cells in a row with respective said bit lines in accordance with a row address, a sense amp control circuit and a sense amplifier;
   a common data line connected to said plurality of memory blocks for transferring data between said memory blocks and outside the memory device;
   a column address decoder for selectively coupling one of said bit lines with said data lines in accordance with a common column address; and
   a block selecting section for selectively activating each of said row address decoders and sense amp controllers in accordance with a block address so that only one sense amplifier within a memory block is activated at any one time; and
   an access control circuit for randomly accessing said memory cells by changing said block address and common column address while maintaining said row address unchanged.

6. A memory device comprising a plurality of memory units and an access control circuit, each of said memory units comprising:
   a plurality of memory blocks each including a plurality of memory cells arranged in a matrix, a plurality of word lines each extending along a corresponding row of said memory cells, a plurality of bit lines each extending along a corresponding column of said memory cells, and a row address decoder for controlling the connection of said memory cells in a row with respective said bit lines in according with a row address, a sense amp control circuit and a sense amplifier;

a common data line connected to said plurality of memory blocks, for transferring data between said memory blocks and outside the memory device; and a column address decoder for selectively coupling one of said bit lines with said data lines in accordance with a common column address;

said access control circuit, responsive to an address set supplied from outside the memory device, for supplying said row address, common column address and block address to said plurality of memory units so that only one memory block column is activated at any one time.

7. A memory device comprising a plurality of memory units and an access control circuit, each of said memory units comprising:

a plurality of memory blocks each including a plurality of memory cells arranged in a matrix, a plurality of word lines each extending along a corresponding row of said memory cells, a plurality of bit lines each extending along a corresponding column of said memory cells, and a row address decoder for controlling the connection of said memory cells in a row with respective said bit lines in according with a row address, a sense amp control circuit and a sense amplifier;

a common data line connected to said plurality of memory blocks, for transferring data between said memory blocks and outside the memory device; and a column address decoder for selectively coupling one of said bit lines with said data lines in accordance with a common column address;

said access control circuit, responsive to an address set supplied from outside the memory device, for supplying said row address, common column address and block address to said plurality of memory units;

wherein said access control circuit randomly accesses said memory cells of said plurality of memory units by changing said block address and common column address while maintaining said row address unchanged such that one memory block column is chosen at any one time.

* * * * *